(12) United States Patent
Tiron et al.

(10) Patent No.: US 10,795,257 B2
(45) Date of Patent: Oct. 6, 2020

(54) METHOD FOR FORMING A FUNCTIONALISED GUIDE PATTERN FOR A GRAPHOEPITAXY METHOD

(71) Applicant: COMMISSARIAT A L'ENERGIE ATOMIQUE ET AUX ENERGIES ALTERNATIVES, Paris (FR)

(72) Inventors: Raluca Tiron, Saint-Martin-le-Vinoux (FR); Nicolas Posseme, Sassenage (FR); Xavier Chevalier, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/304,933

(22) PCT Filed: May 23, 2017

(86) PCT No.: PCT/EP2017/062455
§ 371 (c)(1),
(2) Date: Nov. 27, 2018

(87) PCT Pub. No.: WO2017/202860
PCT Pub. Date: Nov. 30, 2017

(65) Prior Publication Data
US 2019/0278171 A1      Sep. 12, 2019

(30) Foreign Application Priority Data
May 27, 2016   (FR) ...................................... 16 54791

(51) Int. Cl.
*G03F 7/00*        (2006.01)
*G03F 7/004*       (2006.01)
(Continued)

(52) U.S. Cl.
CPC .......... *G03F 7/0002* (2013.01); *G03F 7/0035* (2013.01); *G03F 7/0041* (2013.01);
(Continued)

(58) Field of Classification Search
None
See application file for complete search history.

(56) References Cited

U.S. PATENT DOCUMENTS 4,379,001 A       4/1983   Sakai et al.
5,202,272 A  *    4/1993   Hsieh ................ H01L 21/28132
                                                257/E21.444
(Continued)

FOREIGN PATENT DOCUMENTS

EP    2 276 690 A2    1/2011
FR    2 975 823 A1    11/2012
(Continued)

OTHER PUBLICATIONS

International Search Report as issued in International Patent Application No. PCT/EP2017/062455, dated Aug. 24, 2017.
(Continued)

*Primary Examiner* — Allan W. Olsen
(74) *Attorney, Agent, or Firm* — Pillsbury Winthrop Shaw Pittman LLP

(57) ABSTRACT

A method for forming a functionalised guide pattern for the self-assembly of a block copolymer by graphoepitaxy, includes forming a guide pattern made of a first material having a first chemical affinity for the block copolymer, the guide pattern having a cavity with a bottom and side walls; grafting a functionalisation layer made of a second polymeric material having a second chemical affinity for the block copolymer, the functionalisation layer having a first portion grafted onto the bottom of the cavity and a second portion grafted onto the side walls of the cavity; selectively (Continued)

etching the second portion of the functionalisation layer relative to the first portion of the functionalisation layer, the etching including a step of exposure to an ion beam following a direction that intersects the second portion of the functionalisation layer, such that the ion beam does not reach the first portion of the functionalisation layer.

18 Claims, 2 Drawing Sheets

(51) Int. Cl.
  *G03F 7/075*   (2006.01)
  *G03F 7/11*   (2006.01)
  *H01L 21/311*   (2006.01)
  *H01L 21/033*   (2006.01)
  *B81C 1/00*   (2006.01)
  *H01L 21/3115*   (2006.01)

(52) U.S. Cl.
  CPC .......... *G03F 7/0048* (2013.01); *G03F 7/0752* (2013.01); *G03F 7/11* (2013.01); *H01L 21/0337* (2013.01); *H01L 21/31105* (2013.01); *H01L 21/31111* (2013.01); *H01L 21/31116* (2013.01); *H01L 21/31127* (2013.01); *H01L 21/31133* (2013.01); *B81C 1/00031* (2013.01); *H01L 21/31155* (2013.01)

(56) References Cited

U.S. PATENT DOCUMENTS

| | | | | |
|---|---|---|---|---|
| 6,649,928 | B2* | 11/2003 | Dennison | H01L 27/1021 257/4 |
| 6,750,116 | B1* | 6/2004 | Chen | H01L 21/76237 257/E21.551 |
| 7,078,307 | B2* | 7/2006 | Lin | H01L 27/10867 257/E21.59 |
| 7,557,007 | B2* | 7/2009 | Shimoyama | H01L 29/66621 257/E21.155 |
| 8,481,389 | B2* | 7/2013 | Zhang | H01L 21/823462 257/411 |
| 8,853,085 | B1 | 10/2014 | Abdallah et al. | |
| 9,570,317 | B2* | 2/2017 | Posseme | H01L 21/306 |
| 9,632,408 | B1* | 4/2017 | Cottle | H01L 21/302 |
| 2008/0318005 | A1* | 12/2008 | Millward | G03F 7/40 428/172 |
| 2012/0178956 | A1* | 7/2012 | Dourdain | C01G 23/047 556/417 |
| 2014/0187046 | A1* | 7/2014 | Posseme | H01L 21/31116 438/696 |
| 2014/0256145 | A1 | 9/2014 | Abdallah et al. | |
| 2015/0076108 | A1* | 3/2015 | Chang | G03F 7/40 216/49 |
| 2015/0108549 | A1* | 4/2015 | Benoit | H01L 29/7378 257/197 |
| 2015/0249112 | A1 | 9/2015 | Takeguchi et al. | |
| 2016/0077264 | A1 | 3/2016 | Kang et al. | |
| 2016/0379837 | A1* | 12/2016 | Cheng | H01L 21/0271 438/781 |
| 2019/0196336 | A1* | 6/2019 | Tiron | H01L 21/02118 |
| 2019/0278170 | A1* | 9/2019 | Tiron | H01L 21/31111 |

FOREIGN PATENT DOCUMENTS

| | | | |
|---|---|---|---|
| FR | 3 000 600 | A1 | 7/2014 |
| FR | 3 000 601 | A1 | 7/2014 |
| FR | 3 025 937 | A1 | 3/2016 |
| FR | 3 037 715 | A1 | 12/2016 |
| FR | 3 041 471 | A1 | 3/2017 |
| WO | WO 2009/134635 | A2 | 11/2009 |
| WO | WO 2014/102222 | A1 | 7/2014 |

OTHER PUBLICATIONS

Tiron, R., et al., "Template affinity role in CH shrink by DSA planarization," Optomechatronic Micro/Nano Devices and Components III, Oct. 2007, Proc. of SPIE, vol. 9423, Mar. 2015, XP060051606, pp. 942317-1-942317-11.

Cheng, J., et al., "Customization and Design of Directed Self-Assembly Using Hybrid Prepatterns," Optomechatronic Micro/Nano Devices and Components III, Oct. 2007, Proc. of SPIE, vol. 9423, Mar. 2015, XP060051623, pp. 942307-1-942307-8.

Liu, C.-C., et al., "Fin formation using Graphoepitaxy DSA for FinFET device fabrication," Optomechatronic Micro/Nano Devices and Components III, Oct. 2007, Proc. of SPIE, vol. 9423, Mar. 2015, XP060051595, pp. 94230S-1-94230S-10.

Chevalier, X., et al., "Study and optimization of the parameters governing the block copolymer self-assembly: toward a future integration in lithographic process," Proc. SPIE 7970, Alternative Lithographic Technologies III, 79700Q, Apr. 2011, 11 pages.

Choi, J. W., et al., "A facile route for fabricating graphene nanoribbon array transistors using graphoepitaxy of a symmetric block copolymer," Optomechatronic Micro/Nano Devices and Components III, Oct. 2007, Proc. of SPIE, vol. 9428, Mar. 2015, XP060051918, pp. 94280T-1-94280T-10.

* cited by examiner ured structures, such as for example a two-
METHOD FOR FORMING A FUNCTIONALISED GUIDE PATTERN FOR A GRAPHOEPITAXY METHOD

CROSS REFERENCE TO RELATED APPLICATIONS

This application is the U.S. National Stage of PCT/EP2017/062455, filed May 23, 2017, which in turn claims priority to French Patent Application No. 1654791 filed May 27, 2016, the entire contents of all applications are incorporated herein by reference in their entireties.

TECHNICAL FIELD

The present invention relates to a method for forming a functionalised guide pattern intended for a graphoepitaxy method. The present invention also relates to a graphoepitaxy method using a functionalised guide pattern obtained by such a method.

PRIOR ART

The need for methods making it possible to produce objects having ever smaller dimensions is constantly increasing, and this is so on account of the trend towards miniaturisation of electronic components.

Among the most promising alternative lithography techniques may be cited lithography techniques using self-assembly of block copolymers.

A block copolymer is a polymer composed of several blocks of monomers, for example two blocks of monomers A and B, of different chemical natures, bound together by a covalent bond. When sufficient mobility is given to the chains, for example by heating, the chain A and the chain B have a tendency to phase separate and reorganise to form perfectly organised structures, such as for example a two-dimensional network comprising spheres of A in a matrix of B, or cylinders of A in a matrix of B, or instead intercalated lamella of A and lamella of B.

Block copolymers thus have the property of forming patterns that may be controlled thanks to the ratio of monomers. Moreover, the periodicity of the patterns formed by the block copolymers is directly linked to the molar mass of the block copolymers, such that by controlling this molar mass it is possible to control the resolution of the patterns that they form.

These properties of block copolymers are used within the scope of graphoepitaxy methods. Graphoepitaxy methods generally consist in producing guide patterns on the surface of a substrate, these guide patterns defining cavities within which the block copolymers are going to be deposited to form secondary patterns of better resolution.

However, it is difficult to control the orientation of the secondary patterns with respect to the guide patterns.

Indeed, the orientation of the secondary patterns with respect to the guide patterns depends on the interactions of the monomer blocks of the block copolymer with the surfaces of the guide pattern, with those of the substrate and with air.

If the guide has the same preferential affinity with one of the two phases of the block copolymer at the bottom and on the walls of the guiding cavity, then this phase is going to self-organise at the interface with the guide. Thus the domain that has to be removed preferentially during the revelation step will not traverse the full height of the guide pattern and a residual layer of the other phase of the polymer is going to form at the interface with the substrate. This will be a limitation for the transfer by etching of the block copolymers thereafter.

The most advantageous case is to generate guide patterns having a neutral cavity bottom (equivalent interaction of the two blocks with the substrate) and with the edges of the cavity preferentially affined with one of the two phases of the polymer. In this case the domain of the sacrificial polymer that is going to be removed selectively during the revelation step traverses the entire thickness up to the interface with the substrate, which is very advantageous for the step of transferring the patterns in the substrate by etching (ref. R. Tiron et al, SPIE 2015).

Furthermore, in the case of an A-b-B type block copolymer the control of the interaction energies with the surface may take place for example by grafting A-r-B type random copolymers of judiciously chosen composition (ref. X. Chevalier et al, SPIE 2011).

Methods of the prior art have proposed controlling these interactions by grafting a random polymer to the bottom of the cavity whereas the walls of the cavity remain bare. To do this, the random polymer is diluted then it is deposited by spin coating. During the grafting annealing, a low thickness of the random polymer then fixes itself onto the bottom of the cavity whereas the walls of the cavity remain bare. However, when on the same silicon substrate there are guide patterns with variable densities, even if the method functions for a given pattern, this technique does not work for guides with a higher density because the layer of random polymer is also deposited on the walls of the cavity.

DESCRIPTION OF THE INVENTION

The invention aims to overcome the drawbacks of the prior art by proposing a method making it possible to form a guide pattern for graphoepitaxy wherein the bottom and the walls of the cavities of the guide pattern are functionalised differently, whatever the density of the guide pattern.

To do this, according to a first aspect of the invention, a method is proposed for forming a functionalised guide pattern intended for the self-assembly of a block copolymer by graphoepitaxy, the method comprising the following steps:

forming on a substrate a guide pattern made of a first material having a first chemical affinity with respect to the block copolymer, the guide pattern comprising a cavity comprising a bottom and side walls;

grafting a functionalisation layer made of a second polymer material having a second chemical affinity with respect to the block copolymer, the functionalisation layer comprising a first portion grafted on the bottom of the cavity and a second portion grafted on the side walls of the cavity;

etching the second portion of the functionalisation layer selectively with respect to the first portion of the functionalisation layer, the etching of the second portion of the functionalisation layer comprising a step of exposure to an ion beam directed along a direction secant to the second portion of the functionalisation layer such that the ion beam does not reach the first portion of the functionalisation layer.

The method thus makes it possible to form a guide pattern provided with a cavity of which the bottom is functionalised by a functionalisation layer whereas the side walls remain bare, in such a way that a block copolymer deposited in the cavity does not have the same affinities with its side walls and its bottom. It is thereby possible to control the orientation of the secondary patterns formed in the cavity by the block copolymer. The method is efficient whatever the density of the cavities in the guide pattern.

The method according to the first aspect of the invention may also have one or more of the following characteristics taken individually or according to all technically possible combinations thereof.

Advantageously, the method further comprises before the step of grafting of the functionalisation layer a step of depositing a protective layer on the guide pattern, the protective layer comprising a first portion deposited on the bottom of the cavity and a second portion deposited on the side walls of the cavity. In this case, the protective layer is intercalated between the guide pattern and the functionalisation layer. The first portion of the protective layer is thus intercalated between the bottom of the cavity and the first portion of the functionalisation layer, whereas the second portion of the protective layer is intercalated between the side walls of the cavity and the second portion of the functionalisation layer.

The protective layer makes it possible to protect the guide pattern during the selective etching of the second portion of the functionalisation layer in such a way that it is not attacked. The fact of depositing the protective layer before the formation of the functionalisation layer makes it possible to deposit the protective layer at higher temperature than if the protective layer was deposited after the formation of the functionalisation layer.

Moreover, the protective layer serves as etching stop layer.

The etchings of the second portions of the functionalisation layer and of the protective layer may be carried out using different selective etching techniques.

Thus, according to a first embodiment, the selective etching of the second portion of the functionalisation layer may be an ion beam etching. In this case, the second portion of the functionalisation layer is etched physically by the ion beam. The ion beam is directional and oblique. The direction of the ion beam is chosen in such a way that the first portion of the functionalisation layer is not etched during this step.

The second portion of the protective layer, when it exists, may next be eliminated by a less aggressive method, for example a wet etching selective with respect to the first portions of the protective layer and the functionalisation layer. The protective layer then serves as stop layer to the physical etching, notably when it is made of inorganic material whereas the functionalisation layer is made of organic material (due to the difference in mechanical attack between these two families of materials), and as protective layer of the underlying layers (guide pattern notably).

According to a second embodiment, the selective etching of the second portion of the functionalisation layer may comprise the following sub-steps:
implanting ions having an atomic number less than 10 in the second portion of the protective layer and in the second portion of the functionalisation layer by exposure to the ion beam, in such a way that the second portion of the protective layer and the second portion of the functionalisation layer can be etched selectively with respect to the first portion of the protective layer and to the first portion of the functionalisation layer respectively;
etching the second portion of the functionalisation layer by placing it in contact with an organic solvent;

and the method further comprises a step of etching the second portion of the protective layer selectively with respect to the first portions of the protective layer and the functionalisation layer.

In this embodiment, the second portion of the functionalisation layer is modified by implanting light ions in such a way that this second portion can next be etched selectively with respect to the first portion of the functionalisation layer which has not been modified by implanting light ions (since it has not been reached due to the implantation under oblique incidence). During this ion implantation, the functionalisation layer is thus not etched physically, but uniquely modified chemically locally so as to be able to be etched locally thereafter.

Once the second portion of the functionalisation layer has been etched, the second portion of the protective layer modified by ion implantation is in its turn etched by a selective etching technique. To do this, different selective etching techniques may be used.

Thus, according to a first alternative embodiment, the selective etching of the second portion of the protective layer may be a wet etching using a hydrofluoric acid-based or phosphoric acid-based etching solution. This etching technique has the advantage of etching the modified zones selectively with respect to the non-modified portions and to the cavity.

According to a second alternative embodiment, the selective etching of the second portion of the protective layer may be a dry etching carried out using a remote plasma, the dry etching comprising the following sub-steps:
a first sub-step of forming a salt from a plasma;
a second sub-step of sublimation of the salt.

Dry etching has the advantage of etching the modified zones selectively with respect to the non-modified portions and to the cavity.

Advantageously, the salt is formed from a fluorine and hydrogen-based plasma.

Advantageously, the salt is sublimated by an annealing.

According to a third alternative embodiment, the selective etching of the second portion of the protective layer may be a vapour phase etching. Vapour phase etching has the advantage of having very good selectivity with respect to the first portion of the protective layer.

According to different alternative embodiments:
the vapour phase etching may comprise a step of injecting hydrofluoric acid in vapour phase diluted in a solvent on the layers to be etched;
the vapour phase etching may comprise the following sub-steps:
injecting a gas of hydrofluoric acid into a reaction chamber in which are placed the layers to be etched;
injecting an inert gas into the reaction chamber.

Advantageously, the method may comprise a pre-annealing step before the vapour etching step in order to remove humidity from the surface of the layers to be etched, which makes it possible to increase the etching selectivity.

When the vapour etching forms non-volatile reaction products, the method may also further comprise a step of removing the non-volatile reaction products formed during vapour etching.

The step of removing the non-volatile reaction products may comprise:
a step of solubilising said products in an elimination solution, preferably water; and/or
a step of annealing at a temperature comprised between 100° C. and 300° C.

According to a third embodiment, the etching of the second portion of the functionalisation layer may comprise the following sub-steps:

- implanting ions having an atomic number less than 10 in the second portion of the protective layer by exposure to the ion beam, in such a way that the second portion of the protective layer can be etched selectively with respect to the first portion of the protective layer;
- wet etching of the second portion of the protective layer selectively with respect to the first portion of the protective layer, leading to the elimination of the second portion of the functionalisation layer located on the second portion of the protective layer.

This third mode limits the number of steps since it is no longer necessary to eliminate beforehand the second portion of the functionalisation layer, this portion being removed by lift-off effect, during the etching of the second portion of the underlying protective layer.

Advantageously, in this case a not very dense grafting at the level of the functionalisation layer (shorter temperature and annealing duration) will be chosen to facilitate access of the etching solution.

Advantageously, the step of forming the guide pattern may comprise the following sub-steps:

- depositing at least one base layer on the protective layer;
- etching the base layer by lithography.

Advantageously, the base layer comprises carbon, in order that the guide pattern thereby formed is not modified by the later steps of the method.

Advantageously, the protective layer is a layer of a dielectric inorganic material comprising silicon, which makes it possible to be able to etch it selectively with respect to a carbon guide pattern.

Advantageously, the protective layer has a thickness comprised between 5 and 15 nm and preferably between 5 and 10 nm.

Advantageously, the step of forming the functionalisation layer comprises the following sub-steps:

- depositing a layer of a polymer, preferably by spin coating;
- grafting the layer of the polymer on the substrate, preferably by thermal annealing or photo-crosslinking;
- rinsing using a solvent.

A second aspect of the invention relates to a graphoepitaxy method comprising a method for forming a functionalised guide pattern according to the first aspect of the invention and a step of depositing a block copolymer in the cavity.

Advantageously, the block copolymer comprises at least two monomer blocks, the functionalisation layer having an equivalent affinity with all the monomer blocks.

It is thus possible to produce, by means of the block copolymer, secondary patterns which have an orientation perpendicular to the substrate.

BRIEF DESCRIPTION OF THE FIGURES

Other characteristics and advantages of the invention will become clear on reading the detailed description that follows, with reference to appended FIGS. 1a to 1d, which illustrate the different steps of a method according to one embodiment of the invention.

For greater clarity, identical or similar elements are marked by identical reference signs in all of the figures.

DETAILED DESCRIPTION OF AT LEAST ONE EMBODIMENT

FIGS. 1a to 1d represent the steps of a method for manufacturing a functionalised guide pattern for graphoepitaxy according to one embodiment of the invention.

Figure 2:
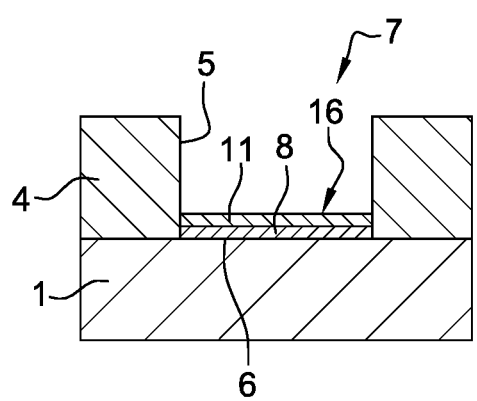
FIG. 2 schematically represents a functionalised guide pattern obtained by the method of FIGS. 1a to 1d.

With reference to FIG. 2, this method makes it possible to obtain a guide pattern 4 for graphoepitaxy comprising at least one cavity 7 of which the bottom 16 is functionalised so as to have a first affinity with the block copolymer that will be deposited in this cavity 7, whereas the side walls 5 remain bare so as to have a second affinity with the copolymer that will be deposited in the cavity 7.

Figure 1A:
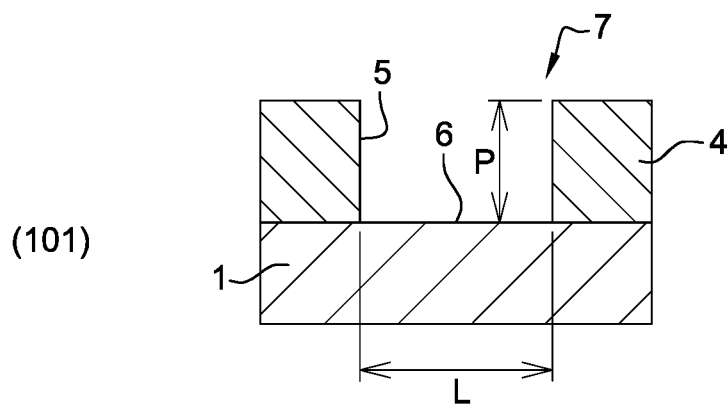

To do this, with reference to FIG. 1a, the method comprises a first step 101 of forming a guide pattern 4 on a substrate 1. The guide pattern 4 comprises at least one cavity 7. The cavity 7 comprises a bottom 6 and side walls 5 extending along a direction secant to the surface of the substrate. More specifically, the side walls 5 preferably extend along a direction perpendicular to the surface of the substrate. The cavity may have different geometries. It may thus take the shape of a cylindrical well, a trench, a well of rectangular section, etc. The guide pattern 4 is preferably made of a material resistant to the etching techniques used during the later steps of the method, for example a material inert to hydrofluoric acid (HF) and/or to phosphoric acid ($H_3PO_4$). To this end, according to a first embodiment, the guide pattern may comprise carbon. Thus, the guide pattern may be made of carbon deposited by centrifugation (also called SOC for spin-on-carbon) or made of any other anti-reflective carbon layer. According to a second embodiment, which may be combined or not with the first, the guide pattern may be covered with a layer resistant to hydrofluoric acid (HF) and/or to phosphoric acid ($H_3PO_4$), such as for example a SiN layer. This SiN layer may be deposited by a conformal deposition technique. This second embodiment makes it possible to make the guide pattern of any type of material, such as for example silicon oxide, then to protect it by depositing above a layer resistant to the etching techniques used during the later steps of the method. The guide pattern could also be made of an inorganic material or TiN. Each cavity 7 preferably has a depth P comprised between 50 and 300 nm. Each cavity 7 preferably has a width L comprised between 30 and 200 nm. The step 103 of forming the guide pattern 4 may comprise the following sub-steps:

- depositing one or more layers on the substrate;
- producing at least one cavity 7 through this or these layers, preferably by lithography, for example by photolithography.

Figure 1B:
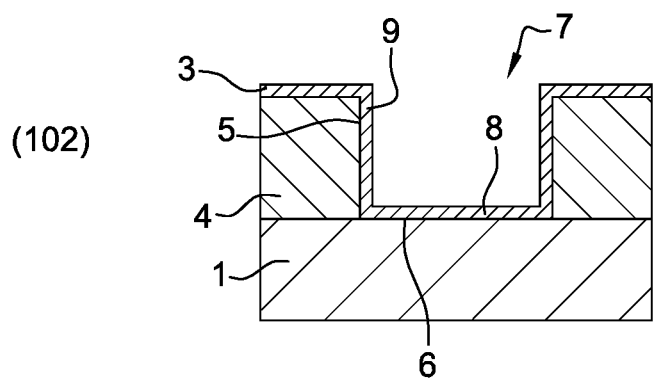

With reference to FIG. 1b, the method may next comprise a step 102 of depositing a protective layer 3 on the guide pattern 4. This protective layer 3 is particularly advantageous when the guide pattern is made of carbon. It serves as etching stop layer. The protective layer 3 is preferably a dielectric inorganic layer comprising silicon. Thus, the protective layer 3 may be a layer of one of the following materials: SiN, SiOC, $SiO_2$, SiCBN. The protective layer 3 preferably has a thickness comprised between 5 and 15 nm, and in a more preferential manner between 5 and 10 nm. The protective layer 3 comprises a first so-called "horizontal" portion 8 deposited on the bottom 6 of the cavity and a second so-called "vertical" portion 9 deposited on the side walls of the cavity. The protective layer 3 preferably comprises a substantially constant thickness such that the thickness of the vertical portion 9 of the protective layer is substantially equal to the thickness of the horizontal portion 8 of the protective layer. The protective layer 3 is deposited by a conformal deposition technique so as to have a constant thickness.

Figure 1C:
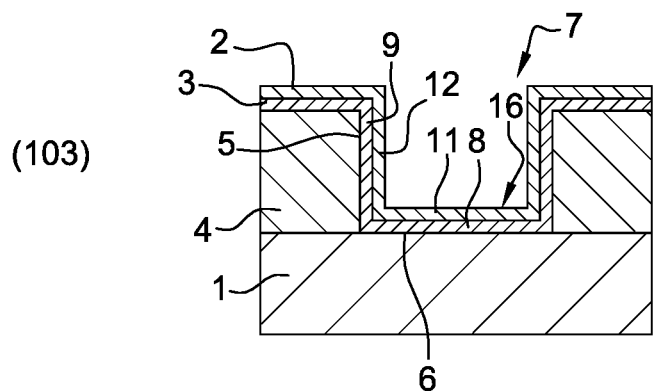

With reference to FIG. 1c, the method next comprises a step 103 of forming a functionalisation layer 2 on the protective layer 3 or directly in the cavity. The functionalisation layer 2 has a substantially constant thickness. The functionalisation layer 2 has a thickness preferably comprised between 2 and 15 nm, and in a more preferential manner between 5 and 12 nm. The functionalisation layer 2 comprises a first so-called "horizontal" portion 11 deposited on the horizontal portion of the protective layer and a second so-called "vertical" portion 12 deposited on the vertical portion 9 of the protective layer. The functionalisation layer 2 preferably comprises a substantially constant thickness such that the thickness of the vertical portion 12 of the functionalisation layer 2 is substantially equal to the thickness of the horizontal portion 11 of the functionalisation layer 2. The functionalisation layer 2 is a layer of a so-called grafted "functionalisation" polymer. The composition of this functionalisation polymer is chosen as a function of the affinity that it is wished to obtain between the bottom 16 of the cavity 7 and the monomer blocks of the block copolymer that will be deposited in this cavity. According to different embodiments, the functionalisation polymer may be a random copolymer, a homopolymer or any other type of graftable polymer being able to be used to control surface energies, such as for example a self-assembled monolayer (SAM). According to a preferential embodiment, the functionalisation polymer may be chosen in such a way that the attraction forces between each of the monomer blocks of the block copolymer and the functionalisation layer are equivalent. In this case, when the block copolymer that will be deposited in the cavity is PS-b-PMMA, the first functionalisation layer could be a layer of PS-r-PMMA, comprising 70% by mass of polystyrene (PS) and 30% by mass of polymethyl methacrylate (PMMA). According to another embodiment, when the block copolymer that will be deposited in the cavity is PS-b-PMMA of lamellar morphology, the first functionalisation layer could be a layer of PS-r-PMMA, comprising 50% by mass of polystyrene (PS) and 50% by mass of polymethyl methacrylate (PMMA).

The step 103 of forming the functionalisation layer 2 preferably comprises a sub-step of depositing a layer of the functionalisation polymer, for example by spin coating. The spin coating may be carried out by diluting the functionalisation polymer in an organic solvent. When the functionalisation polymer is PS-r-PMMA, the organic solvent may be propylene glycol methyl ether acetate (PGMEA). This first sub-step of depositing is preferably carried out in such a way that the thickness of the functionalisation polymer deposited is sufficiently important to completely cover the guide pattern 4. The solution concentration of the second polymer and the speed of deposition will thus be chosen as a function of the height of the guide pattern 4, in such a way that at the end of the step of depositing the functionalisation polymer, the polymer layer completely covers the guide pattern 4. The solution of the functionalisation polymer diluted in the organic solvent may also have a mass concentration of functionalisation polymer substantially equal to 1.5%. The step 103 of forming the functionalisation layer 2 may next comprise a sub-step of fixing, also called grafting, the layer of the functionalisation polymer on the protective layer 3. This grafting may be carried out by thermal annealing or photo-crosslinking. The thermal annealing is preferably carried out at a temperature substantially equal to 250° C., typically between 230° C. and 260° C., for a duration substantially equal to 10 minutes, typically between 5 and 15 minutes. The thermal annealing may be carried out on a hot plate or in a furnace. The step 103 of forming the functionalisation layer 2 may next comprise a sub-step of rinsing during which the surplus of the functionalisation polymer is removed using a solvent. When the functionalisation polymer is PS-r-PMMA, the solvent used may be propylene glycol methyl ether acetate (PGMEA).

Figure 1D:
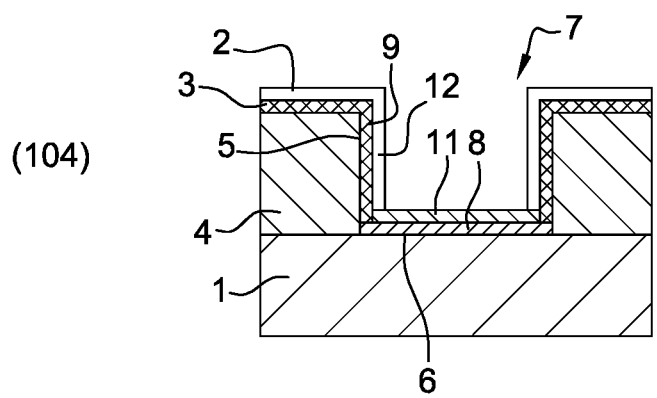

With reference to FIG. 1d, the method next comprises a step 104 of selective etching of the vertical portion 12 of the functionalisation layer and, when it exists, a step of selective etching of the vertical portion 9 of the protective layer 3. At the end of this step, only the horizontal portion 8 of the functionalisation layer 2 and the horizontal portion 9 of the protective layer 3 are conserved whereas the side walls 5 of the cavity 7 remain bare.

To do this, different selective etching techniques may be used.

Thus, according to a first embodiment, this selective etching may be an ion beam etching (IBE). In this case, the etching is a physical etching. The etching by ion beam is directional and the direction of the beam may be chosen so as to only etch the vertical portion 12 of the functionalisation layer 2, while preserving the horizontal portion 11 of this layer arranged at the bottom of the cavity 7. The ion beam is inclined with respect to the vertical portion of the functionalisation layer such that the bottom of the cavity is not reached by the beam.

The angle of incline ⊖ of the ion beam, measured with respect to the horizontal bottom 6 (i.e. parallel to the plane of the substrate) of the cavity 7, is preferably given by the following relationship:

$$\tan\Theta = \frac{P}{L}$$

where P is the cavity depth (measured perpendicularly to the bottom 6; cf. FIG. 1a) and L the cavity width (measured parallel to the bottom 6 in the sectional plane of FIGS. 1a-1d).

The ions used may for example be hydrogen or helium. The etching conditions depend on the constitution of the layers to be etched and their thicknesses.

The protective layer, when it exists, serves as stop layer to the physical etching and protects the underlying layers during the bombardment. It may next be eliminated in a less aggressive manner, for example by means of a wet etching selective with respect to the horizontal portions of the protective layer and the functionalisation layer. Advantageously, a dense grafting at the level of the functionalisation layer (typically in the aforesaid grafting conditions) will be carried out in order to prevent the etching solution accessing the horizontal portion of the protective layer.

According to a second embodiment, the step 104 of selective etching may comprise a first sub-step of implanting light ions in the vertical portion 9 of the protective layer 3 (and potentially in the vertical portion 11 of the functionalisation layer 2), in such a way that it can be etched selectively with respect to the horizontal portion 8 of the protective layer and to the horizontal portion 11 of the functionalisation layer 2. During the implantation of the vertical portion 9 of the protective layer 3, the vertical portion 12 of the functionalisation layer 2 may be etched physically on the surface by the ion beam. This partial etching of the functionalisation layer 2 during the implantation is not however systematic. "Light ions" designate ions of which the atomic number is less than 10. The implantation of light ions is carried out by means of a directional ion bombardment. The ion bombardment is directed along a direction secant to the vertical portion 9 of the protective layer 3.

Thus, in this second embodiment, the ion bombardment is configured uniquely to implant ions in the protective layer and potentially in the functionalisation layer making it possible thereafter to etch them selectively. The directional ion bombardment may be carried out in an ion beam implanter or in an ion beam etcher (IBE). When the directional bombardment is carried out in an ion beam implanter, it is possible to implant any ions of which the atomic number is less than 10, such as for example: Ar, H, He, $N_2$. The implantation conditions may be determined using software (for example SRIM software based on a Monte-Carlo type simulation) making it possible to simulate the implanting profiles and depths of a given species in a given material.

According to the second embodiment, the step 104 of selective etching may next comprise a sub-step of selective etching of the vertical portion 12 of the functionalisation layer by placing it in contact with an organic solvent. During this step, the whole of the functionalisation layer 2 is placed in contact with the organic solvent, but only the vertical portion 12 of the functionalisation layer 2, in which light ions have been implanted, is etched. This embodiment thus makes it possible to use an isotropic etching technique, while only etching the vertical portion of the functionalisation layer. The organic solvent depends on the functionalisation layer 2. Thus, when the functionalisation layer is a layer of PS-r-PMMA, the solvent used may be propylene glycol methyl ether acetate (PGMEA). The duration of exposure of the functionalisation layer to the solvent depends on the thickness to be etched. This duration must not be too long so as not to consume too much the horizontal portion 11 of the functionalisation layer.

According to the second embodiment, the step 104 of selective etching may next comprise a sub-step of etching the vertical portion 9 of the protective layer 3 selectively with respect to the horizontal portion 8 of the protective layer 3, to the horizontal portion 11 of the functionalisation layer 2 (and preferably to the guide pattern 4). This selective etching of the vertical portion 9 of the protective layer 3 may be carried out using different etching techniques. These etching techniques may be isotropic.

Thus, according to a first alternative embodiment, the selective etching of the vertical portion 9 of the protective layer 3 may be a wet etching. The wet etching may be carried out using a hydrofluoric acid-based or phosphoric acid-based etching solution. The whole of the protective layer 3 is placed in contact with the etching solution, but only the vertical portion 9 of the protective layer 3, in which light ions have been implanted, is etched during this step. In the case of a hydrofluoric acid-based solution, the etching solution is preferably diluted to 1%. The duration of exposure of the protective layer to the etching solution depends on the thickness of the layers to be etched and on the concentration of the etching solution. It generally varies between 1 second and 10 minutes. This duration of exposure is chosen in such a way that the vertical portion 9 of the protective layer 3 is etched whereas the horizontal portion 8 of the protective layer is conserved.

For example in the case where the protective layer is a SiN layer of 10 nm, the duration of exposure is of the order of 30 seconds, both for a hydrofluoric acid-based or a phosphoric acid-based etching solution.

According to a second alternative embodiment, the selective etching of the vertical portion of the protective layer may be a dry etching. A remote plasma is used to this end. The etching step then preferably comprises two sub-steps:
a first sub-step of forming a salt from a plasma;
a second sub-step of sublimation of the salt.

The salt is preferably formed from a fluorine and hydrogen-based plasma. To this end nitrogen trifluoride may be used on the one hand and dihydrogen or ammonia on the other hand. The salt may be formed by placing the plasma for a duration comprised between 1 and 5 seconds at 2 Torr, at a temperature below 100° C.

The salt is preferably sublimated by an annealing. The annealing is preferably carried out at a temperature above 100° C. and preferably comprised between 150° C. and 200° C.

For example, when the protective layer 3 is a SiN layer of 10 nm thickness, the dry etching may comprise the following sub-steps:
a sub-step of forming a salt by means of plasma carried out with a flow rate of $NH_3$ comprised between 50 and 300 $cm^3$/minutes, at 30° C. for 45 seconds;
a step of sublimation of the salt by means of an annealing at 180° C. for one minute.

According to a third alternative embodiment, the selective etching of the vertical portion 9 of the protective layer 3 may be a vapour phase etching.

To do this, according to a first alternative embodiment, hydrofluoric acid in vapour phase diluted in a solvent may be used. This approach enables better selectivity with respect to the non-exposed portion of the protective layer. A cleaning step is then necessary to remove the salts formed after the etching step.

According to a second alternative embodiment, a gas of hydrofluoric acid may be injected into a reaction chamber in which are placed the layers to be etched. An inert gas is simultaneously injected into the reaction chamber. This inert gas makes it possible to adjust the ratio of hydrofluoric acid injected into the reaction chamber, and thus the etching speed. The ratio of hydrofluoric acid injected into the reaction chamber is preferably comprised between 10% and 90%. The flow rates of each of the two gases may be controlled independently. This etching may be carried out at ambient pressure and temperature or at a pressure below ambient pressure and at a temperature above ambient temperature. According to a preferential embodiment, the temperature is comprised between 15° C. and 80° C. and the pressure is comprised between 40 Torr and 760 Torr. The etching duration depends on the thickness to be etched. It is preferably comprised between 1 second and 10 minutes.

As an example, when the protective layer is a SiN layer of 10 nm thickness, the vapour etching may be carried out by injecting 31% of gas of hydrofluoric acid and 69% of dinitrogen, at ambient pressure and temperature, for two minutes.

Optionally, a pre-annealing may be carried out before the vapour etching to eliminate any humidity. This pre-annealing is preferably carried out at a temperature above 100° C. The duration between the pre-annealing and the vapour etching is preferably less than 1 h in order to limit the uptake of water. To this end, the pre-annealing and the vapour etching are preferably carried out in the same apparatus.

Furthermore, following the vapour etching, a post-treatment is preferably carried out making it possible to remove all the non-volatile reaction products that have been created during the vapour etching.

To do this, the reaction products may for example be eliminated by solubilising them. To this end, the substrate can be rinsed using water, preferably deionised, for example for 10 minutes. The water can circulate on the guide pattern or be vaporised thereon.

Alternatively, the reaction products may also be eliminated by volatilising them. To do this, an annealing at low pressure may be carried out. As an example, this annealing may be carried out at a temperature of 200° C., a pressure of 1.5 Torr, by injecting a gas comprising dinitrogen and 4% of dihydrogen with a flow rate of 2000 cm$^3$/minute, for 180 seconds.

According to the second embodiment, the step 104 of selective etching may alternatively comprise, directly after the implantation, the selective etching of the vertical portion 9 of the protective layer 3 by wet etching. This etching leads to the elimination, by lift-off effect, of the vertical portion 12 of the functionalisation layer 2. The wet etching may be carried out using a hydrofluoric acid-based or phosphoric acid-based etching solution as described previously.

To facilitate the access of the etching solution through the functionalisation layer, it is possible to resort to a less dense grafting of the functionalisation layer. To do this, the functionalisation layer is for example annealed (after spin coating) at a lower temperature and/or for a shorter duration. Typically, the functionalisation polymer may be grafted at a temperature comprised between 150 and 170° C. and/or for a time less than 3 or even 2 minutes, such that the density of grafted species is lower.

The method thus makes it possible to manufacture a guide pattern provided with a cavity of which the bottom is functionalised with a functionalisation layer whereas the side walls are left bare.

The guide pattern may next be used in a graphoepitaxy method, and notably in a method for directed self-assembly (DSA) of block copolymers in order to generate patterns of very high resolution and density.

The graphoepitaxy method may then comprise a step of depositing a block copolymer in the cavity 7 of the guide pattern 4.

This block copolymer could notably be one of the following:
PS-b-PMMA: polystyrene-block-polymethyl methacrylate,
PS-b-PLA: polystyrene-block-polylactic acid,
PS-b-PEO: polystyrene-block-polyethylene oxide,
PS-b-PDMS: polystyrene-block-polydimethylsiloxane,
PS-b-PMMA-b-PEO: polystyrene-block-polymethyl methacrylate-block-polyethylene oxide,
PS-b-P2VP: polystyrene-block-poly(2vinylpyridine).

The block copolymer does not have the same affinities with the bottom of the cavity covered with the functionalisation layer and with its side walls such that the functionalisation of the cavity makes it possible to control the orientation of the secondary pattern produced by means of the block copolymer in the cavity.

Of course, the invention is not limited to the embodiments described with reference to the figures and alternatives could be envisaged without going beyond the scope of the invention. The functionalisation layer could thus have other compositions than those described previously. Similarly, other block copolymers could be used. The invention is not limited either to the solvents given as an example in the detailed description. Furthermore, the invention has been described in the case where the guide pattern comprises a single cavity. However, it is applicable whatever the number of cavities in the guide pattern.

The invention claimed is:

1. A method for forming a functionalised guide pattern intended for the self-assembly of a block copolymer by graphoepitaxy, the method comprising:
   forming on a substrate a guide pattern made of a first material having a first chemical affinity with respect to the block copolymer, the guide pattern comprising a cavity comprising a bottom and side walls;
   grafting a functionalisation layer made of a second polymer material having a second chemical affinity with respect to the block copolymer, the functionalisation layer comprising a first portion grafted on the bottom of the cavity and a second portion grafted on the side walls of the cavity;
   etching the second portion of the functionalisation layer selectively with respect to the first portion of the functionalisation layer, the etching of the second portion of the functionalisation layer comprising a step of exposure to an ion beam directed along a direction secant to the second portion of the functionalisation layer such that the ion beam does not reach the first portion of the functionalisation layer.

2. The method according to claim 1, wherein the etching of the second portion of the functionalisation layer is an ion beam etching.

3. The method according to claim 1, further comprising, before the grafting of the functionalisation layer, depositing a protective layer on the guide pattern, the protective layer comprising a first portion deposited on the bottom of the cavity and a second portion deposited on the side walls of the cavity.

4. The method according to claim 3, wherein the etching of the second portion of the functionalisation layer comprises the following sub-steps:
   implanting ions having an atomic number less than 10 in the second portion of the protective layer by exposure to the ion beam, in such a way that the second portion of the protective layer can be etched selectively with respect to the first portion of the protective layer;
   wet etching of the second portion of the protective layer selectively with respect to the first portion of the protective layer, leading to the elimination of the second portion of the functionalisation layer located on the second portion of the protective layer.

5. The method according to claim 3, wherein the protective layer is a layer of a dielectric inorganic material comprising silicon.

6. The method according to claim 3, wherein the etching of the second portion of the functionalisation layer comprises the following sub-steps:
   implanting ions having an atomic number less than 10 in the second portion of the protective layer and in the second portion of the functionalisation layer by exposure to the ion beam, in such a way that the second portion of the protective layer and the second portion of the functionalisation layer can be etched selectively with respect to the first portion of the protective layer and to the first portion of the functionalisation layer respectively;
   etching the second portion of the functionalisation layer by placing it in contact with an organic solvent;

the method further comprising a step of etching the second portion of the protective layer selectively with respect to the first portions of the protective layer and the functionalisation layer.

7. The method according to claim 6, wherein the etching of the second portion of the protective layer is a wet etching using a hydrofluoric acid-based or phosphoric acid-based etching solution.

8. The method according to claim 6, wherein the etching of the second portion of the protective layer is a dry etching carried out using a remote plasma, the dry etching comprising the following sub-steps:
   a first sub-step of forming a salt from a plasma;
   a second sub-step of sublimation of the salt.

9. The method according to claim 8, wherein the salt is formed from a fluorine and hydrogen-based plasma.

10. The method according to claim 8, wherein the salt is sublimated by an annealing.

11. The method according to claim 6, wherein the etching of the second portion of the protective layer is a vapour phase etching.

12. The method according to claim 11, wherein the vapour phase etching comprises a step of injecting hydrofluoric acid in vapour phase diluted in a solvent on the layers to be etched.

13. The method according to claim 11, wherein the vapour phase etching comprises the following sub-steps:
   injecting a gas of hydrofluoric acid into a reaction chamber in which are placed the layers to be etched;
   injecting an inert gas into the reaction chamber.

14. The method according to claim 11, further comprising a pre-annealing step before the vapour etching step.

15. The method according to claim 11, wherein the vapour etching forms non-volatile reaction products, the method further comprising a step of removing the non-volatile reaction products formed during vapour etching, the step of removing the non-volatile reaction products comprising:
   a step of solubilising said products in an elimination solution; and/or
   a step of annealing at a temperature comprised between 100 and 300° C.

16. The method according to claim 15, wherein the elimination solution is water.

17. A graphoepitaxy method comprising a method for forming a functionalised guide pattern according to claim 1 and a step of depositing a block copolymer in the cavity.

18. The graphoepitaxy method according to claim 17, wherein the block copolymer comprises at least two monomer blocks, the functionalisation layer having an equivalent affinity with all the monomer blocks.

* * * * *